United States Patent [19]

Patel et al.

[11] 4,446,188
[45] May 1, 1984

[54] MULTI-LAYERED CIRCUIT BOARD

[75] Inventors: Harshad K. Patel, Los Angeles; Andjelko Illick, Downey, both of Calif.

[73] Assignee: The Mica Corporation, Culver City, Calif.

[21] Appl. No.: 105,723

[22] Filed: Dec. 20, 1979

[51] Int. Cl.³ .................. B32B 3/10; B32B 15/04
[52] U.S. Cl. .................................... 428/138; 428/192; 428/457; 428/426; 428/458; 428/460; 428/464; 428/473.5; 428/480; 428/418; 428/901
[58] Field of Search ............... 428/140, 139, 138, 131, 428/192, 78, 457, 320, 322, 901, 458, 464, 426, 418, 460, 480, 473.5; 174/68.5; 29/625, 626

[56] References Cited

U.S. PATENT DOCUMENTS

| | | | |
|---|---|---|---|
| 1,609,222 | 11/1926 | Taylor | 428/139 |
| 2,003,494 | 6/1935 | Reynolds | 428/139 |
| 3,030,237 | 4/1962 | Price | 428/901 X |
| 3,102,213 | 8/1963 | Bedson et al. | 317/101 |
| 3,340,607 | 9/1967 | Shutt | 29/625 |
| 3,352,730 | 11/1967 | Murch, Jr. | 174/68.5 |
| 3,485,934 | 12/1969 | Prather | 174/68.5 |
| 3,491,197 | 1/1970 | Walkow | 174/68.5 |
| 3,537,176 | 11/1970 | Healy et al. | 29/625 |
| 3,541,222 | 11/1970 | Parks et al. | 174/68.5 |
| 3,564,114 | 2/1971 | Blinder | 174/68.5 |
| 3,571,923 | 3/1971 | Shabeen | 29/625 |
| 3,621,116 | 11/1971 | Adams | 174/68.5 |
| 3,626,081 | 12/1971 | Little | 174/68.5 |
| 3,634,602 | 1/1972 | Bruck | 174/68.5 |
| 3,654,097 | 4/1972 | Degnan | 204/15 |
| 3,680,209 | 8/1972 | Hacke | 29/625 |
| 3,691,632 | 9/1972 | Smith | 156/182 X |
| 3,988,408 | 10/1976 | Haining et al. | 156/253 |
| 4,030,190 | 6/1977 | Varker | 174/68.5 |
| 4,211,603 | 7/1980 | Reed | 428/901 X |

Primary Examiner—Lorraine T. Kendell
Attorney, Agent, or Firm—Joseph E. Mueth

[57] ABSTRACT

A layered clad laminate with universal center plane adapted for the manufacture of printed wiring board comprising an electrically conductive self-sustaining, integral metal center sheet having, in repetitive fashion, a series of predetermined patterns of punched or photochemically developed openings therein, said sheet being pressed between electrical insulating layers of resin impregnated reinforcing material, said layers being adhered to said sheet and to each other through said openings, and on each of the outer surfaces of said laminate and adhered thereto a layer of electrically conductive metal foil which is essentially uniform and imperforate.

5 Claims, 9 Drawing Figures

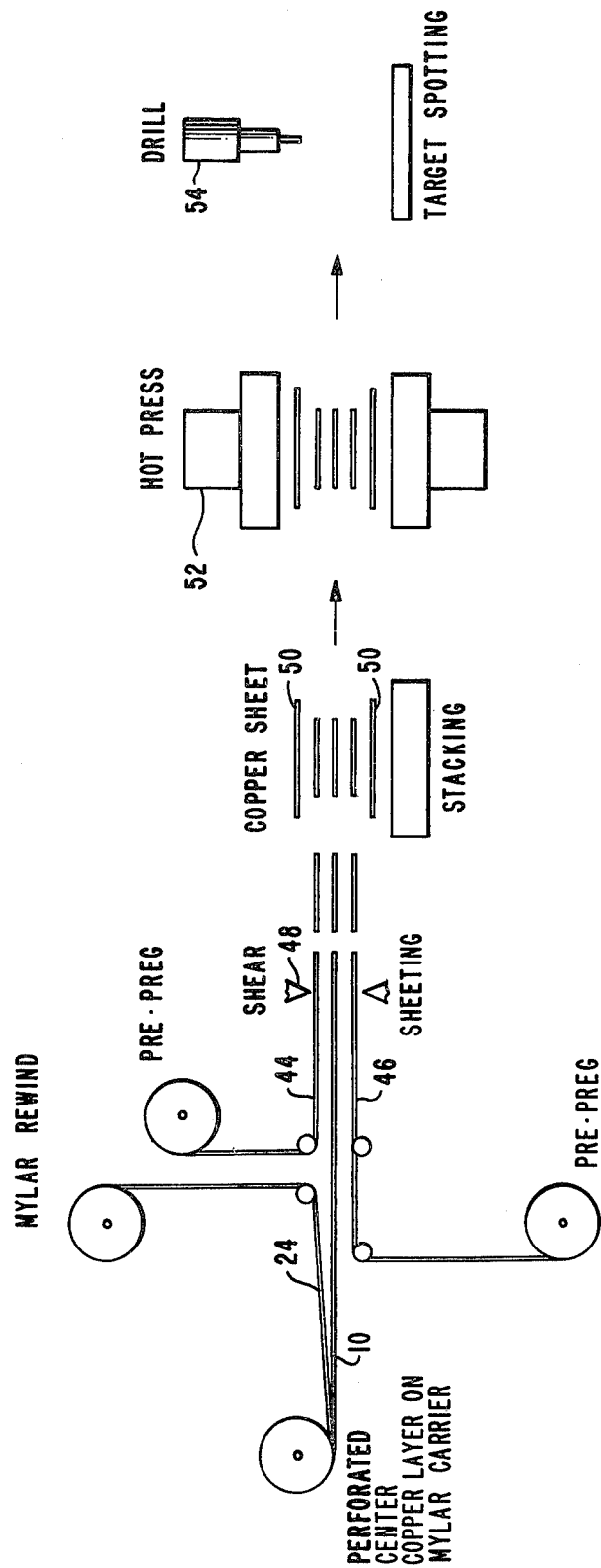
FIG.—6

MULTI-LAYERED CIRCUIT BOARD

BACKGROUND OF THE INVENTION

It is known that printed wiring boards can be developed on a flexible (film) or rigid (laminate) substrate covered by a conductive metal such as copper foil. The majority of printed wiring boards, sometimes hereinafter referred to as "PWB's", have two layers covered with circuitry. Components such as integrated circuits, capacitors and resistors are mounted on one side of the board. The board has at least one power and ground terminal. The components are interconnected by copper conduits. In order to save space, on a two-sided board the conduits run parallel with no intersection of conduits being allowed. When a cross-connection is necessary, three avenues of approach are possible: (1) expand the circuitry and board surface to accommodate the winding lines; (2) install an insulating bar with a conduit on the top that runs across the conduits (busbar); or (3) make a "multilayer" construction. Multilayer constructions provide high density circuitry as well as cross-connections between layers.

Conventional multilayer PWB's are manufactured by a relamination process wherein a laminate circuitry is developed and then either several of such laminates are bonded together (pin relamination) or additional layers of dielectric and copper are laminated on top of the "core" and subsequently multiple circuitry is developed. The interconnecting of the planes is achieved by drilling holes through the finished multilayer laminate and by plating the holes to provide conduits. The circuit design of the individual planes is such that, when aligned, the drilled hole will pass through a solid copper pad for the instances in which a connection has to be made or, through an etched space (hole) for the instance where no connection is desired. Typically individual circuit planes are designed to be ground or power planes only. If a multiple power supply is required, additional planes are necessary. The steps necessary in the process make it lengthy and expensive.

According to the present invention, there has been developed a method of manufacturing three-layered laminates for printed wiring boards in which the design of the center copper plane makes it unrestricted and universal in regard to the size of the PWB that will be cut out of the sheet and to the intended possible multiple use of the center layer. The manufacturing process is a one-shot sandwich lamination in which a prepunched or photochemically developed self-sustaining center copper sheet is pressed between layers of glass fabric which is impregnated with resin (prepreg). On the outside of the laminated stack are two layers of solid copper foil, preferably that have been suitably treated to promote adhesion to the prepreg. The design of the center copper layer has a recurring series of patterns of holes and is such that any size PWB or combination thereof can be cut out from the laminate. The center copper layer can be used as power, ground or combination plane, or as a heat sink. The alignment of the center layer grid-work pattern and the eventual design of outer circuitry and ensuing hole drilling is accomplished through the use of an overlay sheet. The circuit designer is thus afforded great flexibility in the location of ICs, resistors and other elements.

SUMMARY OF THE INVENTION

Briefly, the present invention comprises a layered clad laminate with universal center plane adapted for the manufacture of printed wiring board comprising an electrically conductive self-sustaining, integral metal center sheet having, in repetitive fashion, a series of predetermined pattern of punched or photochemically developed openings therein, said sheet being pressed between electrical insulating layers of resin-impregnated reinforcing material, said layers being adhered to said sheet and to each other through said openings, and on each of the outer surfaces of said laminate and adhered thereto a layer of electrically conductive foil which is essentially uniform and imperforate.

It is an object of this invention to provide a novel laminate.

It is a further object of this invention to provide an improved laminate for PWB applications.

More specifically, it is an object of this invention to provide a multilayer laminate having a universal center plane.

These and other objects of this invention will be apparent from the following detailed description, particularly when taken in conjunction with the drawings.

DESCRIPTION OF THE PREFERRED EMBODIMENTS

Turning to the drawings:

FIG. 6 shows the final assembly of the perforated center sheet, resin-impregnated reinforcing fabric layers, and outer conductive metal foils to form the clad laminate.

Figure 1:
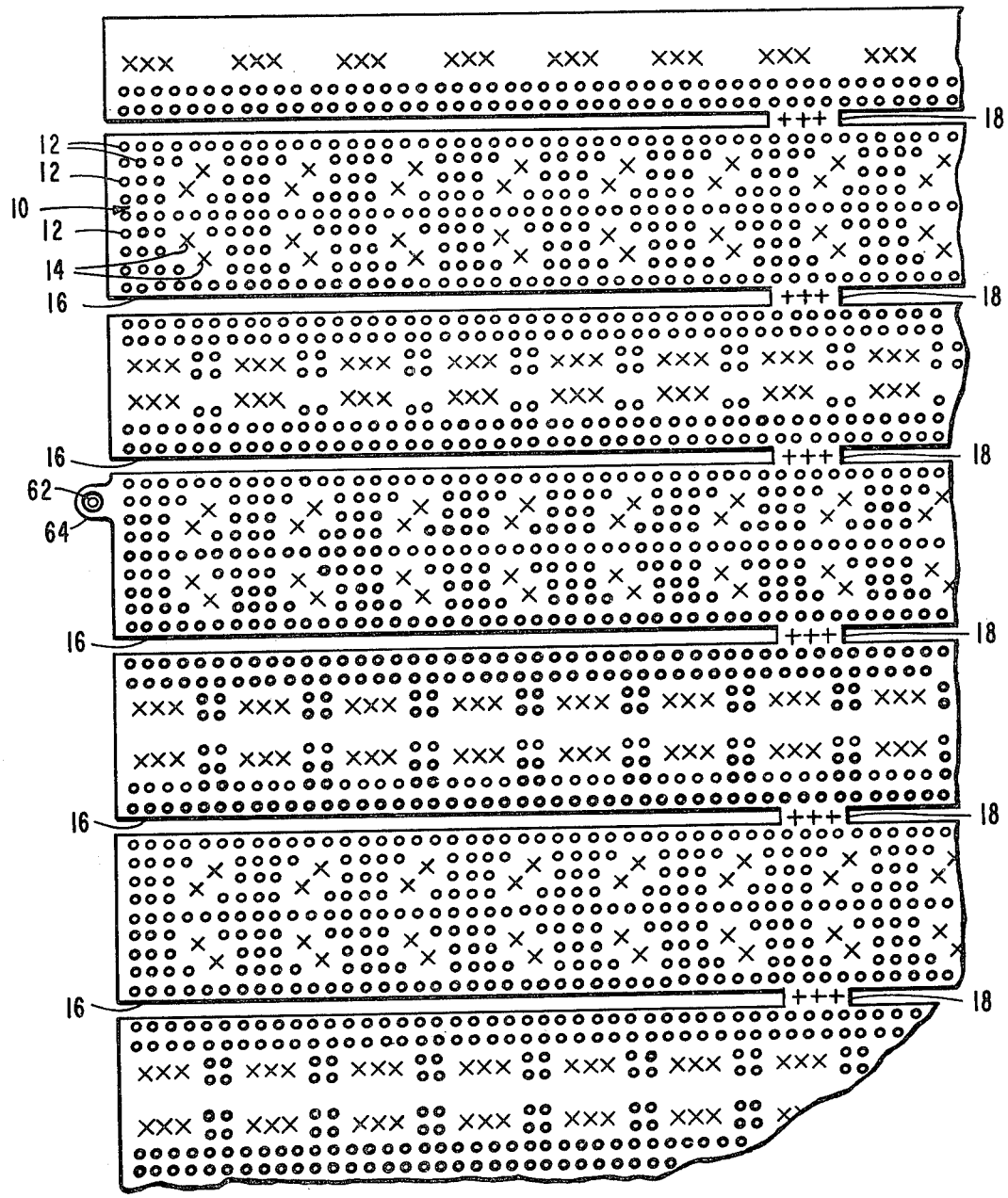
FIG. 1 is a schematic view of the self-sustaining perforated electrically conductive center sheet present in the clad laminate of this invention.

FIG. 1 shows a schematic view of the perforated self-supporting center copper layer 10. In this Figure, the copper areas or pads are shown as "Xs" and the perforations or holes as "Os". The distances and locations of holes 12, pads 14 and separation slots 16 are indicated.

The holes and pads comprise a predetermined pattern. This pattern can be repeated in each section, or as in the drawings, in alternating sections. In any case, each section is connected by copper bridging paths 18. It is to be understood that bridging paths 18 are integral with the copper pads 14. The bridging paths are intended to be subsequently removable at the option of the circuit designer. When the bridging paths 18 are drilled through the board, sections become separated.

Figure 2:
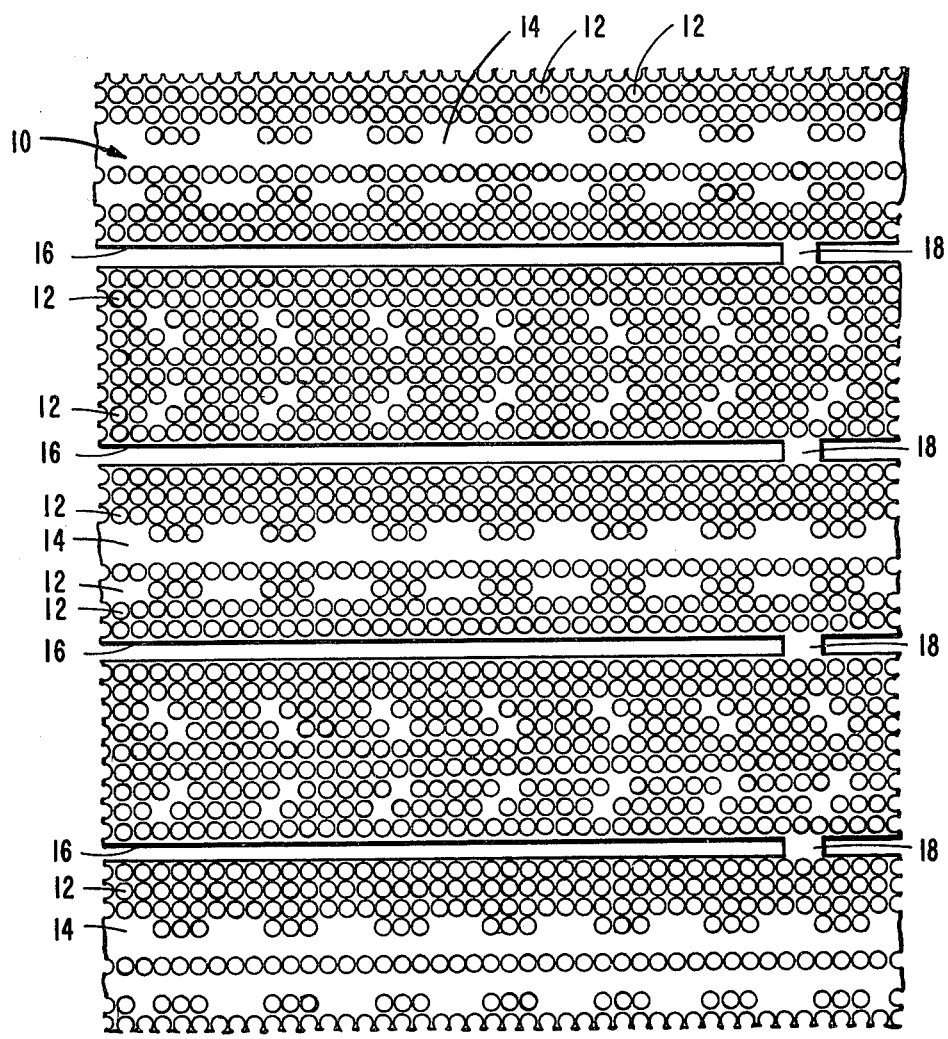
FIG. 2 shows a greatly enlarged plan view of a portion of the center sheet which is the upper right hand portion of FIG. 1.
Figure 3:
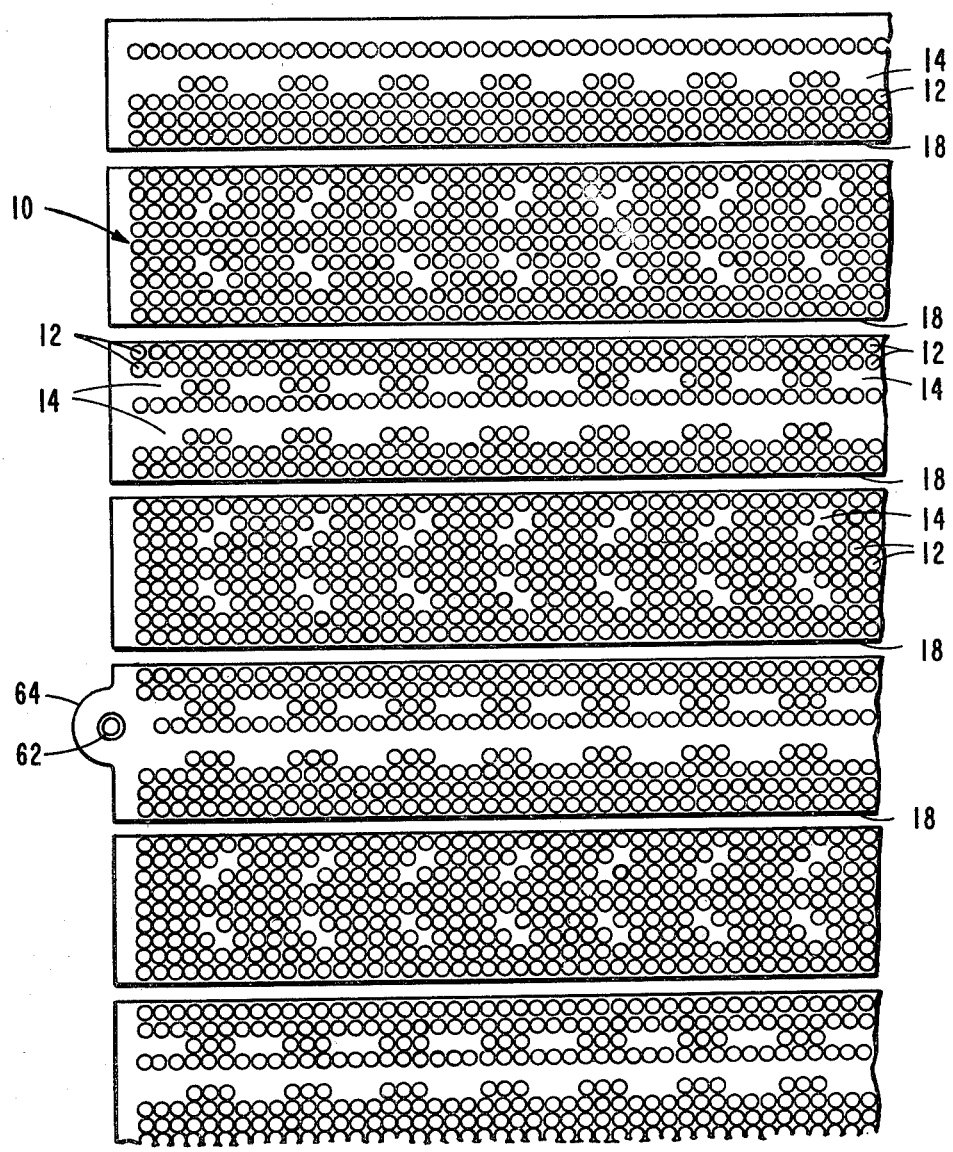
FIG. 3 shows a greatly enlarged plan view of the upper left hand corner of the center sheet of FIG. 1.
Figure 4:
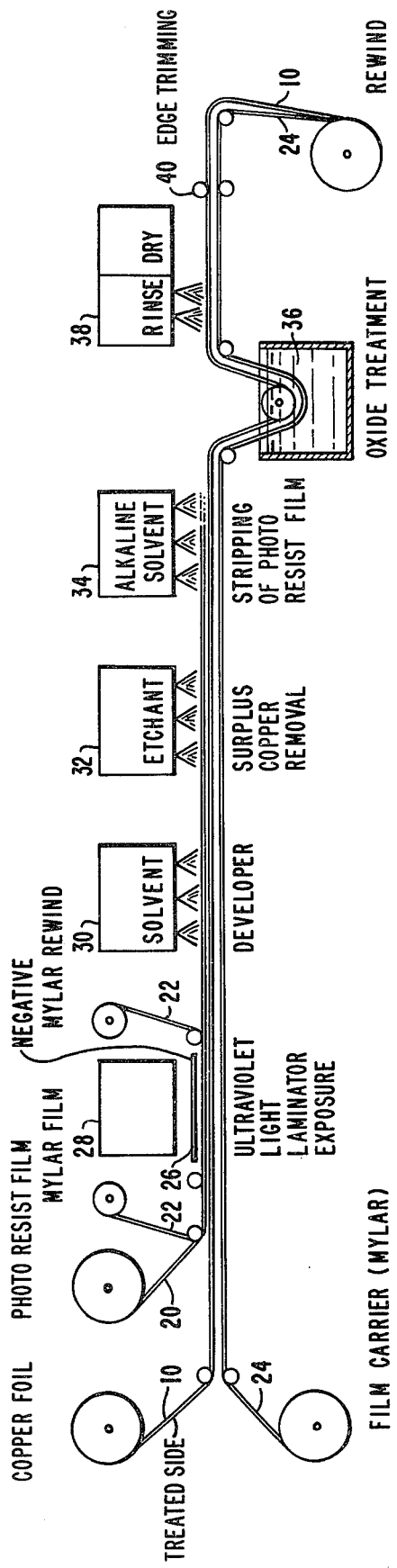
FIG. 4 shows the etching method of making the self-sustaining perforated electrically conductive center sheet of FIG. 1.

FIG. 4 shows the manufacture of center copper layer 10 using conventional photo methods. Photoresist film 20 with mylar carrier 22 is applied continuously on one side of the copper. On the treated side a separate mylar film 24 is applied and glued to the copper 10. The artwork 26, which is a negative of the image shown in FIGS. 1 through 3 is printed on the copper 10 with UV light 28. The top mylar film 22 is removed and the circuit image is developed at station 30 by selective dissolving of the photoresist film 20. The copper 10 is then forwarded to the etching unit 32 where the excess copper is etched away using conventional etching solutions. The photoresist is stripped off in alkaline solvent unit 34. The copper proceeds through oxidative acid bath 36 where the non-treated (top) side of the copper is chemically oxidized to form an active surface. This step is followed by rinsing with water and drying at station 38. The glued edge is trimmed with rotating blades 40 and the finished, self-sustaining copper foil 10 is wound up with the mylar film 24 still in place as carrier. The foil 10 weighs on the order of 1 to 2 ounces per square foot.

Figure 5:
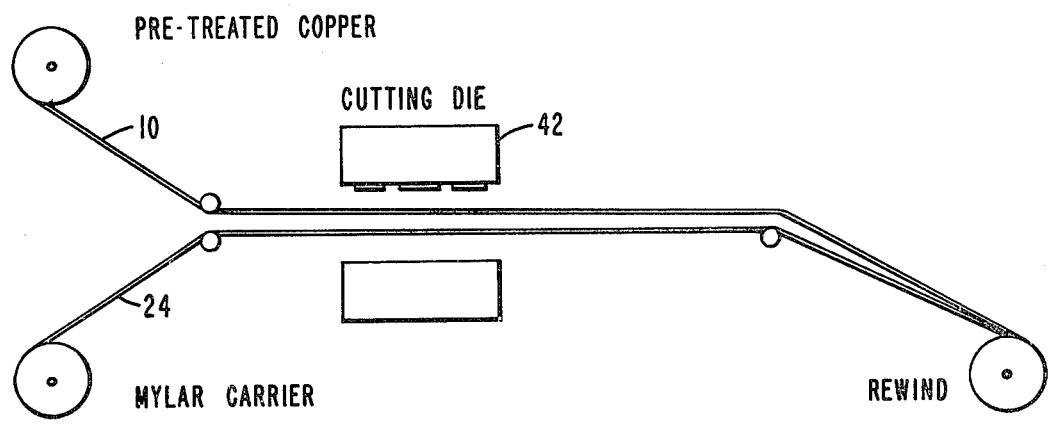
FIG. 5 shows the punch out method of making the self-sustaining perforated electrically conductive center sheet of FIG. 1.

FIG. 5 shows the manufacture of the center copper layer 10 using die cutting method, an alternate embodiment of the invention. The copper 10 may have a conventional electrodeposited treatment on both sides to improve bonding. This copper sheet passes through the die 42 with mylar film 24 as carrier. The die-pins are arranged to generate the repetitive hole and slot pattern as shown in FIG. 1. The punched, self-sustaining copper is wound on the rewind roll with mylar film in place.

FIG. 6 shows the final manufacture of three layered copper clad laminate. The mylar film 24 is peeled off and resin impregnated glass fabric layers 44 and 46 take its place. The copper is sheared at station 48 along with the glass fabric to the desired size. This forms the core of the final laminate. One imperforate uniform copper sheet 50 is placed on each side of the core and the final lamination is carried out in a hot press 52. The targets are spotted and tooling holes are drilled through at station 54.

Figure 7:
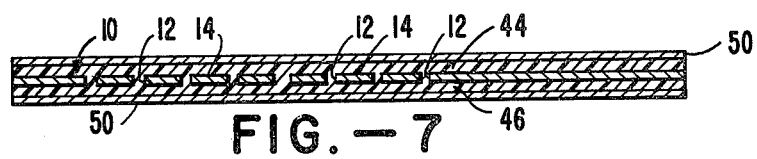
FIG. 7 is a sectional view of a laminate of this invention taken on line 7—7 of FIG. 8.

FIG. 7 shows the center layer 10, resin layers 44 and 46 and the outer copper layers 50. The resin in layers 44 and 46 tend to migrate during curing into holes 12 between pads 14 to form an integral, interlocked structure. The bridges 18 are not shown in FIG. 7, although such would appear if the section had been taken along a line running through a bridge. While in the embodiment shown in FIG. 7, the self-sustaining copper center sheet runs to the edge of the laminate, it is preferred that the center sheet stop slightly short of the edge of the laminate so that the edge area is resin and its reinforcement only, to provide electrical insulation at the edge.

Figure 8:
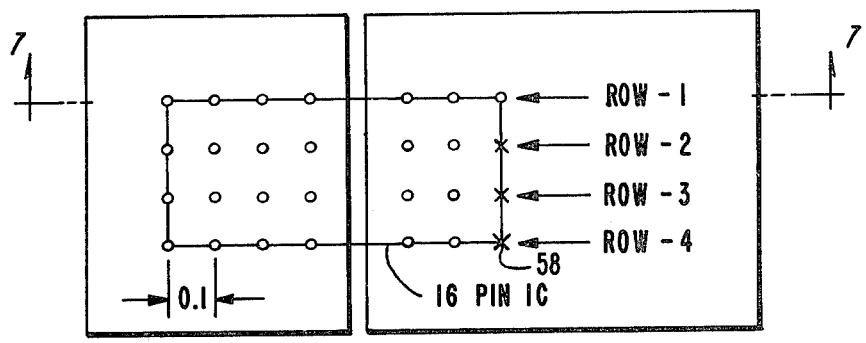
FIG. 8 illustrates the center sheet in relation to a 16 pin IC wherein there is one ground plane connection with the rest of the pins being separated from either ground or power plane.

In FIG. 8, the power for the 16 pin IC is supplied through one of the pins 58. That pin is connected to the center layer of this invention which functions as a power plane. The design of the center plane is such that it enables any combination of one or more ground plane connections while the rest of the pins still can be separated from either ground or power plane. In the example of a design that is shown in FIG. 8, "X" in the figure represents, a 'pad' while "O" represents 'holes.' As shown in FIG. 8, a 16 pin IC is placed in such a way that one pin is connected to one pad while the other fifteen pins do not touch any pads at all. In mounting the components, the same method of location is applied. If a component must get power through one terminal, that terminal or lead will be located in such a way that it will be connected to a pad. There are eight pins in Row 1 and eight pins in Row 4. As shown in FIG. 8, Row 2 and Row 3 of holes do not play any part in IC location so they can be replaced by any zig-zag pattern of pads and holes so that more components can be mounted.

In FIG. 9, there is again schematically shown a sixteen pin IC positioned with respect to the self-sustaining perforated center layer. In Row 1, one pin contacts a pad. In Row 4 another pin contacts a pad. The center bridge 60 can be removed from the final laminate by drilling through the laminate, and in this way, the center layer can function as a power plane in Sec 1 and as a ground plane in Sec 2. Rows 2 and Rows 3 of holes do not, of course, touch any of the IC pins.

The following example is for purposes of illustration.

EXAMPLE I

A self-sustaining copper foil of a thickness of about 0.002 inches was coated with a conventional photoresist material and exposed through a negative of the desired pattern. After washing away the unexposed resist and etching to create a repetitive series of predetermined patterns of perforations, the copper foil, as shown in FIGS. 1–3, on the mylar film carrier was ready for lamination. The center foil with a predetermined pattern of perforations in a repetitive series was then provided with fiberglass fabric impregnated with a heat curable epoxy resin on each side and imperforate copper foils were placed on the outside of the insulating layers. After curing at 175° C., a unitary laminate was obtained.

The method of using the self-sustaining copper center layer as ground plane is similar to the use of the center layer as a power plane. The integrated circuit can be placed in such a way that one of the pins that needs the ground connections is connected to the pad. More than one pin can be connected to the ground plane. In that case, a tracer on the outer copper plane connects all those pins to the pin that is connected to the pad.

Figure 9:
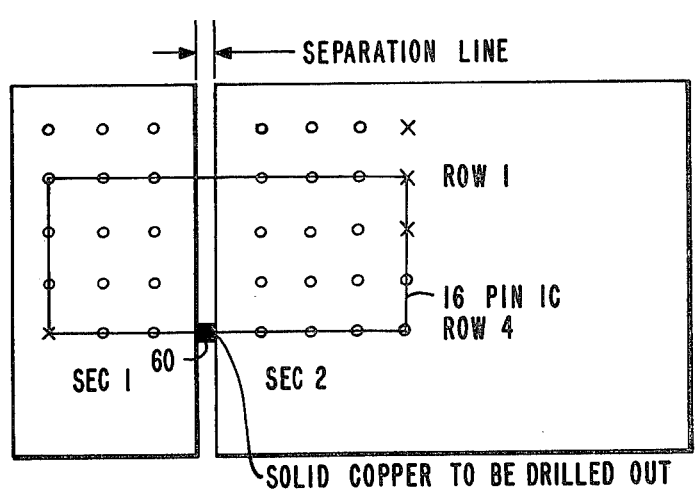
FIG. 9 shows a 16 pin IC in relation to the center sheet with bridging paths which can be drilled out to isolate Set 1 from Set 2.

The same self-sustaining copper central layer can be used as power and ground planes. Thus, it can serve as four, five, or multiple-layer board too. As shown in FIG. 9, there are cutting lines running in the center layer. The 16 pin IC can be located as shown in FIG. 9. If the solid copper areas are drilled out, then Sec 1 and Sec 2 are electrically isolated. Separate sets can be used as power and/or ground planes.

FIG. 8 shows a cut-out piece of the three layer board which illustrates the cutting of odd-sized printed wire boards. In order to avoid shorts through the housing and supporting hardware, the periphery of the PWB must be electrically isolated from the rest of the center plane. This is achieved by drilling out the four solid copper areas 18 shown in FIG. 2. Preferably, in the area where the targets 62 are located, the center plane 10 does not extend to the edge of the laminate and there is no possibility of an electrical short since the margin of the laminate fully encapsulates the center sheet 10 including the tabs 64 carrying the targets 62. This means three sides of the center layer are electrically isolated.

The center layer 10 as a whole section can also be used as a heat sink. The heat generating components are connected to the pads in the center layer. The heat from the center layer is then dissipated through the housing and supporting hardware.

The invention offers an off-the-shelf laminate that can be used as ready made multilayer boards. The user has to design and develop only the outer layers. The laminate has three copper layers and the center layer can be used as a ground, single or multiple power plane or a combination thereof. Any size PWB can be cut. No relamination is necessary.

The key points of the invention are the design of the center copper plane and the method of handling the perforated foil in the process of lamination.

The perforated electrically conductive center sheet 10 is shown in FIGS. 1, 2 and 3. It features an array of holes and slots arranged in such a way that the physical integrity of the foil is preserved. The geometry of the holes and pads is such that it can accommodate any type of IC and components in any arrangement. It enables any combination of one or more ground plane connections while the rest of the IC pins can still be separated from either ground or power plane.

Different sections of the center plane 10 can be electrically isolated by drilling holes through the interconnecting copper bridges 18; they can then be used to run different voltages in the same plane, e.g., $-5, +5, +10$ etc. Similarly, by drilling holes on the fringes of the cut-out PWB, the conductive edge of the center plane is electrically separated from the rest of the board thus preventing possible shorts through the housing and supporting hardware. Due to this feature, any size PWB can be cut from the laminate. The design provides strategically located targets for the alignment with the standard overlay grid work. The targets are arranged so that any size PWB board can be cut with the targeting still preserved. The targets are exposed in the raw laminate by adequate routing and drilling. The transparent overlay grid work contains coordinated design of the initially invisible center plane.

The copper used is of high purity, 99.9%. The center copper sheet weighs typically 2 oz/sq. ft. and has adequate treatment on both sides. The treatment is provided through electrodeposition of crystals or through chemical oxidation. The outer copper layers as a rule have treatment deposited on the inside only. The weight of the outer copper foil can be varied to suit the PWB design. The process of manufacturing the center copper sheet is illustrated in FIGS. 4 and 5.

The photo process (FIG. 4) involves known methods of resin photo-chemistry. The feature of the process of this invention is the mylar carrier that is glued to copper on the outer edges thus forming a continuous envelope that prevents the chemicals from seeping to the back of the copper foil. The design of the universal center layer is such that it can be manufactured by die-cutting or drilling (FIG. 5).

The final lamination is illustrated in FIG. 6. The center copper layer is continuously supported by either mylar film or by the resin impregnated glass fabric. The lamination is performed in the press. The board is finished when the alignment targets are spotted and drilled.

The advantages of the concept are:

1. Universal design provides the option for different functions (e.g. ground, different voltages, etc.) in the same (middle plane). This is accomplished by a simple drilling of strategically placed separation holes.

2. One shot lamination yields a multilayer core with circuitry in place offering manufacturing economies of a simple copper clad laminate.

3. Any size and design printed circuit board can be cut from the standard laminate. Possible shorts of the inner layer via housing and supporting hardware is avoided by simple drilling of few holes.

Because the center sheet is stabilized before the outer circuitry is printed and no subsequent relamination is involved, the hole to hole registration and dimensional stability are assured. The laminates of this invention can be tested prior to the use and thus the loss of an expensive multilayer board due to delamination is avoided. The designs can be easily changed, which is of particular interest in prototype work. The present invention provides a laminate as an off-the-shelf item. There is no expenditure and time delays for printing and etching of internal layers and subsequent relamination. The possibility of further relamination is preserved thus giving the option of manufacturing complicated boards simply and with better consistency. The center sheet 10 can also be used as a heat sink plane.

The use of the targets 62 to align the center layer 10 with a thin paper or plastic overlayer placed on the outside surface of the laminate, said overlayer being of a repetitive pattern to the pattern of the center layer, enables the user to locate the holes, pads and bridges, and permits accurate drilling. The targets 62 provide the reference point. The user drills through the outer layers of the laminate to first locate the target. Once the target on center layer 10 is aligned with the target on the overlayer, all else falls into alignment, and drilling as desired can be accomplished.

The highly conductive layers of the laminate preferably consists of a pre-formed metal foil such as copper foil, tinned copper foil, aluminum foil, zinc foil or silver foil, and any convenient foil thickness may be used, for instance 0.002 inch.

The insulating layers may be any of the materials known to those skilled in the art. For example, the insulating layers may be a polyimide such as those based on organic diamines and dicarboxylic or tetracarboxylic acids. The epoxy resins based on the polyglycidyl ethers of organic polyphenols are also preferred. These resinous layers contain any of the familiar reinforcing materials such as fiberglass fabric. The insulating layers can also be phenolic resin-impregnated paper, melamine resin-impregnated paper, or polyester resin containing chopped glass reinforcement.

Having fully described the invention, it is intended that it be limited only by the lawful scope of the appended claims.

1. A layered clad laminate with universal center plane adapted for the manufacture of printed wiring board comprising an electrically conductive self-sustaining, integral metal center sheet having, in repetitive fashion a series of predetermined patterns of drilled, punched or photochemically developed openings therein, said sheet being pressed between electrical insulating layers of resin impregnated reinforcing material, said layers being adhered to said sheet and to each other through said openings, and on each of the outer surfaces of said laminate and adhered thereto a layer of electrically conductive metal foil which is essentially uniform and imperforate.

2. The laminate of claim 1 wherein the conductive metal is copper.

3. The laminate of claim 1 wherein the center sheet comprises a series of larger sections joined by smaller connecting bridges which are adapted to be removed to provide for a plurality of electrically isolated sections.

4. The laminate of claim 1 wherein the center sheet weighs from about 1 to 2 ounces per square foot of area.

5. The laminate of claim 1 wherein the center sheet terminates short of the edge of the laminate to provide an insulating peripheral margin in said laminate.

* * * * *